(12) United States Patent
Kaufmann et al.

(10) Patent No.: US 10,436,817 B2
(45) Date of Patent: Oct. 8, 2019

(54) TEST MATRIX ADAPTER DEVICE

(71) Applicant: TDK-Micronas GmbH, Freiburg (DE)

(72) Inventors: Timo Kaufmann, Waldkirch-Suggental (DE); Klaus Heberle, Emmendingen (DE); Joerg Franke, Freiburg (DE); Oliver Breitwieser, Gundelfingen (DE)

(73) Assignee: TDK-Micronas GmbH, Freiburg (DE)

( * ) Notice: Subject to any disclaimer, the term of this patent is extended or adjusted under 35 U.S.C. 154(b) by 363 days.

(21) Appl. No.: 15/429,796

(22) Filed: Feb. 10, 2017

(65) Prior Publication Data

US 2017/0227578 A1    Aug. 10, 2017

(30) Foreign Application Priority Data

Feb. 10, 2016   (DE) .................. 10 2016 001 425

(51) Int. Cl.
*G01R 1/04* (2006.01)
*G01R 31/28* (2006.01)

(52) U.S. Cl.
CPC ....... *G01R 1/0416* (2013.01); *G01R 31/2886* (2013.01)

(58) Field of Classification Search
CPC ........ G01R 1/04; G01R 1/0416; G01R 31/28; G01R 31/2886; G01R 31/2889; G01R 31/2896
See application file for complete search history.

(56) References Cited

U.S. PATENT DOCUMENTS

| 5,789,804 | A | * | 8/1998 | Matsuoka | .......... | H01R 13/2442 |
| | | | | | | 257/669 |
| 5,986,459 | A | * | 11/1999 | Fukaya | ................ | G01R 1/0483 |
| | | | | | | 324/756.02 |
| 5,990,692 | A | | 11/1999 | Jeong et al. | | |
| 6,583,402 | B1 | | 6/2003 | Watanabe | | |
| 2007/0296419 | A1 | * | 12/2007 | Aizawa | .............. | G01R 31/2893 |
| | | | | | | 324/537 |

(Continued)

FOREIGN PATENT DOCUMENTS

DE     197 18 870 A1   11/1997
DE     199 08 979 A1    9/1999

*Primary Examiner* — Son T Le
(74) *Attorney, Agent, or Firm* — Muncy, Geissler, Olds & Lowe, P.C.

(57) ABSTRACT

A test matrix adapter device having a plurality of segments arranged in a plane, the respective segments have line-shaped and column-shaped frame sections, and the segments are connected to one another in a form-fitting manner by the frame sections. Semiconductor receiving devices are arranged within the segments, that each have a plurality of first contact surfaces that are spaced apart from one another. The semiconductor receiving device are form-fittingly connected by webs to the frame sections of an assigned segment. The semiconductor receiving device has a bottom side and a base region at least partially enclosed by a frame, and an outer side. The column-shaped frame sections have projections that have second contact surfaces that are connected by conductor tracks to the first contact surfaces. The semiconductor receiving device adapted to receive a packaged semiconductor component with terminal contacts and to connect the terminal contacts to the first contact surfaces.

17 Claims, 3 Drawing Sheets

(56) References Cited

U.S. PATENT DOCUMENTS

2009/0314607 A1* 12/2009 Karino ............... G01R 31/2893
198/341.01
2011/0024911 A1* 2/2011 Shibuya ................ G01R 27/14
257/773

* cited by examiner

TEST MATRIX ADAPTER DEVICE

This nonprovisional application claims priority under 35 U.S.C. § 119(a) to German Patent Application No. 10 2016 001 425.3, which was filed in Germany on Feb. 10, 2016, and which is herein incorporated by reference.

BACKGROUND OF THE INVENTION

Field of the Invention

The invention relates to a test matrix adapter device.

Description of the Background Art

IC packages have, on an outside, so-called pins or contact pads with which the integrated circuits configured in the IC packages are electrically connected. In this case, a plurality of IC package types are configured. For each type of IC package, a receiving device is to be provided which takes into account the shape of the IC package and the number of electrical connections.

SUMMARY OF THE INVENTION

It is therefore an object of the invention to provide a device which further develops the prior art.

According to an exemplary embodiment of the invention, a test matrix adapter device is provided with a plurality of segments arranged in a plane, wherein the respective segments have frame sections arranged in the shape of lines and columns, and the segments are connected to one another in a non-positive manner by means of the frame sections.

The test matrix adapter device has a semiconductor receiving device arranged within the segments, the semiconductor receiving device each having a plurality of first contact surfaces spaced apart from one another, and the semiconductor receiving device being form-fittingly connected by means of webs to the frame sections of an assigned segment.

The semiconductor receiving device comprises a lower side and a base region at least partially enclosed by a frame, and an outer side. The frame of the semiconductor receiving device has an inner surface and an outer surface.

On the column-shaped frame sections, projections, i.e., block-like elevations, are arranged, the projections having second contact surfaces and the second contact surfaces being connected by means of conductor tracks to the first contact surfaces.

The semiconductor receiving device is designed to receive a packaged semiconductor component with terminal contacts and to connect the terminal contacts to the first contact surfaces.

The first contact surfaces can be electrically connected via a low-impedance connection to the second contact surfaces by means of conductor tracks. The semiconductor receiving device of the test matrix adapter device is equipped with semiconductor components, hereinafter also referred to as IC, then molded and subsequently measured on a final tester. In this case, the height of the frame of the semiconductor carrier is greater than the thickness of the semiconductor component that is to be molded. The semiconductor components, which are molded in the semiconductor receiving devices, are punched out after measuring, in that preferably the webs of the semiconductor receiving devices are removed. For this purpose, the individual semiconductor receiving devices can also be lasered out.

An advantage of the device according to the invention is that a large number of semiconductor components can be measured during the final measurement on the "final tester" without having to insert a further semiconductor component into a test socket after each measurement. Set-up times can be reduced. Studies have shown that the test matrix adapter device can be reliably fitted with a receiving frame of the final tester that is set up for this purpose.

Another advantage is that the electrical contacting is performed on the second contact surfaces, i.e., the contact pads on the future package are not damaged during the final measurement. In particular, a visual inspection of the contact pads after final measurement is unnecessary. The yield is thereby increased, and the cost reduced.

In an embodiment, the segments arranged in the form of a matrix are quadrangular and arranged in a flat plane. As a result, the matrix frame as a whole can be inserted into a prearranged receptacle, i.e., a measurement card of a final tester.

In an embodiment, in each case precisely one semiconductor receiving device is formed in the segments, wherein the base region is completely enclosed by the square frame and the conductor tracks connecting the first contact surfaces are guided from the inside surface over the top surface to the outer surface of the frame. Furthermore, conductor tracks are guided along the webs to the second contact surfaces.

In an embodiment, the conductor tracks are in each case integrally formed with the contact surfaces, and or the conductor tracks are form-fittingly connected with the support, that is, with the webs and/or the frame sections. Preferably, the conductor tracks are designed narrower than the contact surfaces.

In an embodiment, the webs are formed from a plastic and or from a metal forming the conductor tracks. The first contact surfaces are preferably formed on the inside and/or in the base region. Studies have shown that the entire test matrix device, inclusive of the webs and the projections, can be inexpensively produced by injection molding, and subsequently, the contact surfaces and conductor tracks can be easily attached to the surface.

In an embodiment, the base region of the semiconductor receiving device is planar. Alternatively, the base region has a topography. One advantage is that different dies and semiconductor components can be inserted form-fittingly with the base.

In an embodiment, the projection has a cuboid shape, wherein the second contact surfaces are formed on the front side and/or on the rear side of the projection. It is understood that the second contact surfaces on the front side of the projection and the second contact surfaces on the rear side of the projection are assigned to the projection of the respective semiconductor receiving device which is directly adjacent to the projection.

The frame sections with the projections as well as the semiconductor receiving device can be produced in a particularly simple and cost-effective manner by means of an injection molding process from a plastic that is suitable for this purpose.

In an embodiment, the semiconductor component to be measured can be located within the frame on the base region of the semiconductor receiving device. In another development, the semiconductor receiving device is designed to accommodate bare semiconductor components, so-called dies. It is understood that the dies are electrically connected to the contact surfaces within the semiconductor receiving device.

In an embodiment, the semiconductor receiving device has on the underside large first contact surfaces acting as a capacitive sensor. The first contact surfaces are preferably designed as half-circles.

The test matrix adapter device can be used for contacting semiconductor packages, preferably IC packages, in a receiving frame in a final tester.

Because the second contact surfaces can be made larger as conductor tracks, use of the second contact surfaces is preferred by means of a double contacting for force/sense measurements.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
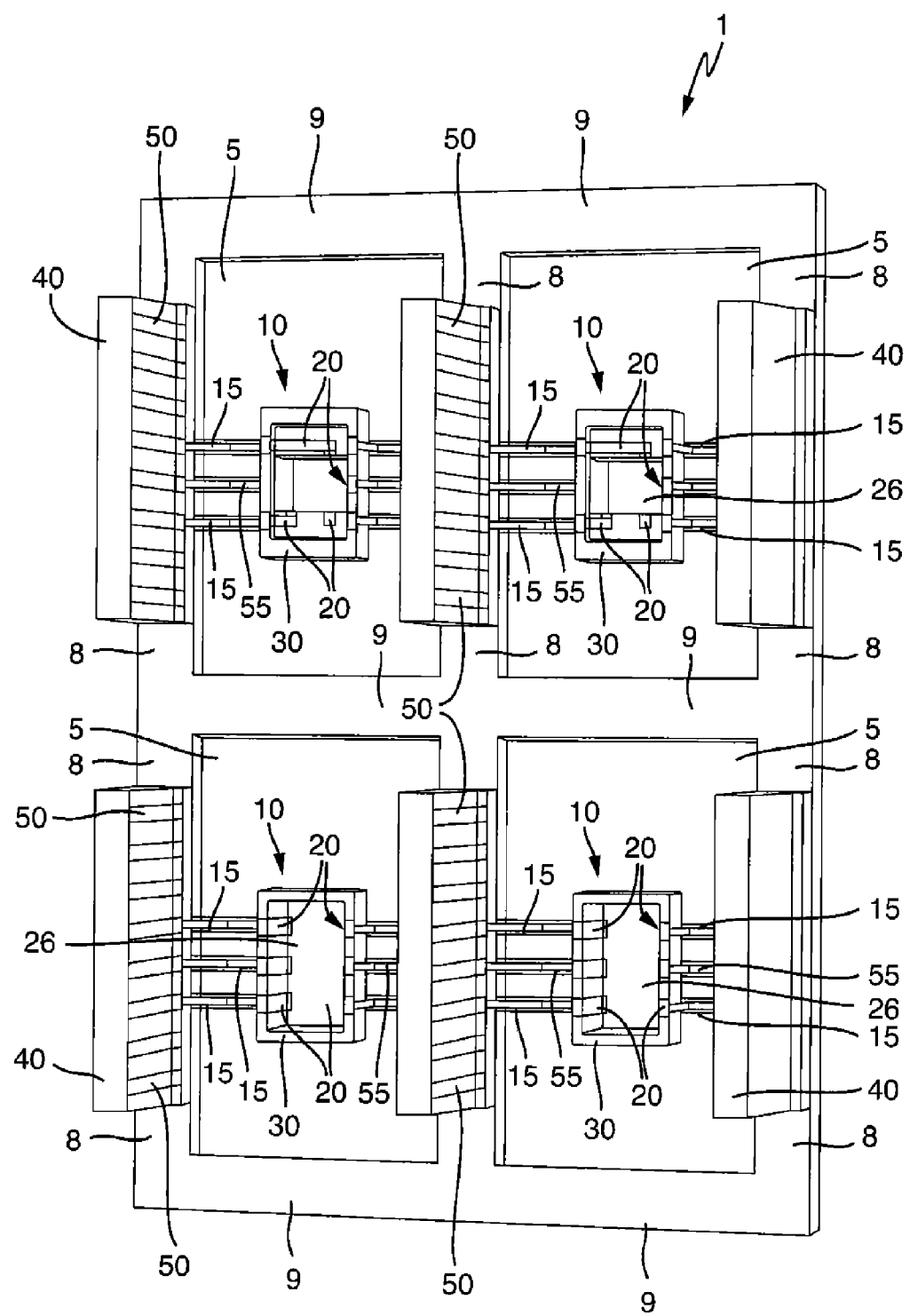
FIG. 1 illustrates an exemplary embodiment according to the invention of a test matrix adapter device with four segments.

FIG. 1 shows an exemplary embodiment according to the invention of a test matrix adapter device 1 with four segments 5 arranged in a flat plane. The respective segments 5 have frame sections 8 arranged in lines and frame sections 9 arranged in columns, each of the segments 5 being fully enclosed by the frame sections 8 and 9. The individual segments 5 are form-fittingly connected to one another by means of the frame sections 8 and 9. The test matrix adapter device 1 is manufactured by means of an injection molding process and comprises a plastic compound which is electrically insulating.

Semiconductor receiving devices 10 are arranged in each of the segments 5, the semiconductor receiving device 10 being form-fittingly connected by means of webs 15 to the column-shaped frame sections 8.

The semiconductor receiving devices 10 each have a plurality of first contact surfaces 20 spaced apart from one another. The contact surfaces 20 are electrically conductive and preferably made of a metal, for example copper.

The semiconductor receiving device 10 comprises a lower side 22 and a base region 26 completely enclosed by a frame 24. The frame 24 of the semiconductor receiving device 10 has an inner surface 28 and a cover surface 30 and an outer surface 32. The semiconductor receiving device 10 is designed to receive a packaged semiconductor component, for example an IC with terminal contacts, and to connect the terminal contacts of the IC to the first contact surfaces 20. In the case of two semiconductor receiving devices 10 shown in the lower portion of FIG. 1, the base region 26 is planar, and in the case of the two semiconductor receiving devices 10 shown in the upper portion of FIG. 1, the base region 26 shows a topography. One advantage is that ICs with different packaging designs can be accommodated.

On the frame sections 8 arranged in a column shape are block-shaped projections 40 having a front side and a rear side. The projections 40 have second contact surfaces 50 on the front side and/or on the rear side. The second contact surfaces 50 are electrically connected to the first contact surfaces 20 by means of conductor tracks 55. The conductor tracks 55 are formed on the upper side of the webs 15.

The measurement card of a final tester is connected to the second contact surfaces 50 by means of a receiving device. As a result, the ICs arranged in the semiconductor receiving device 10 can be measured reliably and in the plurality simply in succession, without having to individually measure each IC. It is understood that the semiconductor components, or the ICs, are molded in the final tester prior to measuring, i.e. the semiconductor receiving device is filled with a molding compound.

Figure 2:
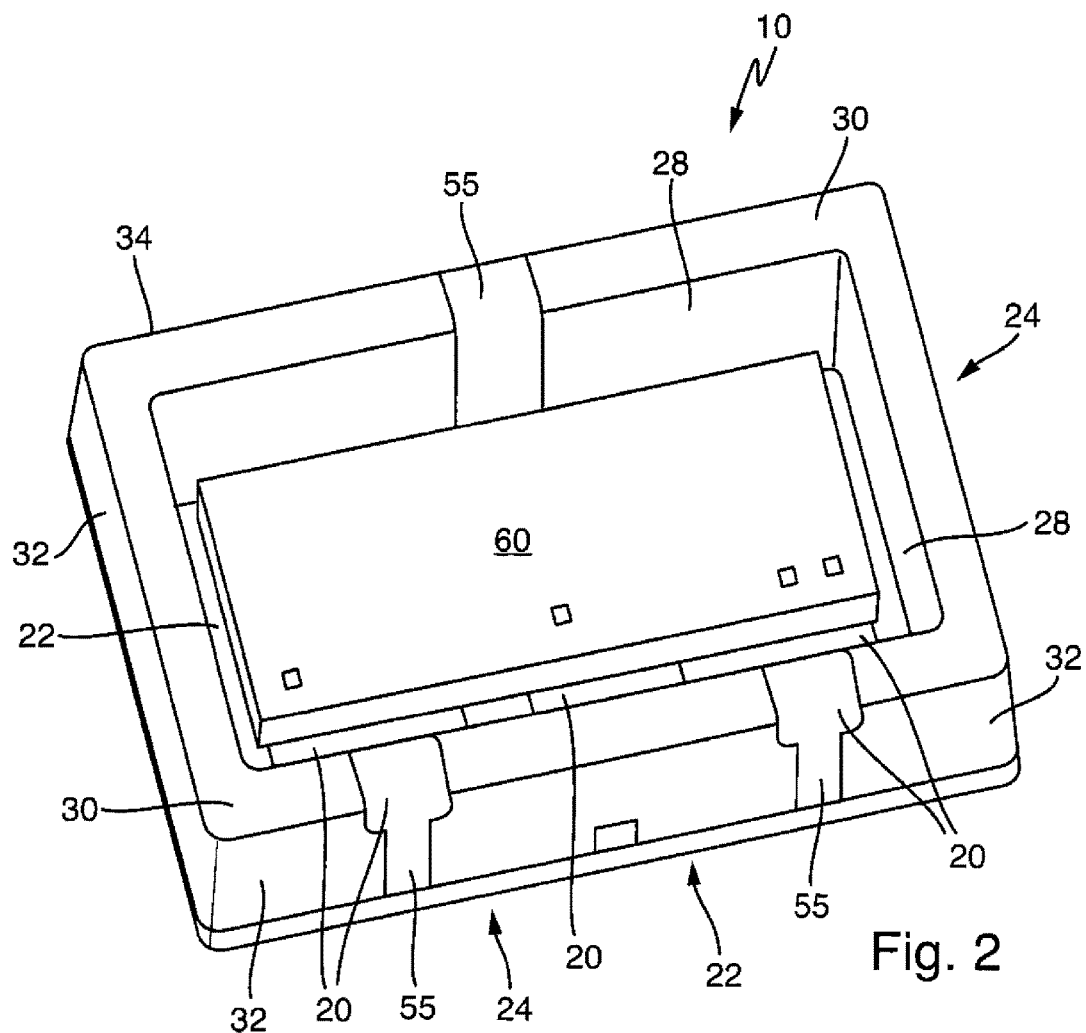
FIG. 2 is a detailed illustration of a single semiconductor receiving device shown in FIG. 1.

FIG. 2 shows a detailed illustration of the semiconductor recording device 10, illustrated in connection with the drawing documents of FIG. 1. In the following, only the differences from the embodiment of FIG. 1 are explained. The base region 26 of the semiconductor receiving device 10, which is completely enclosed by the square-shaped frame 24, is covered almost completely by a semiconductor component 60 designed as an IC 60. First contact surfaces 20 to the electrical connection of the ICs not shown are formed on the inner surface 28 as well as on the base region 26.

The conductor tracks 55 connecting the first contact surfaces 20 are guided from the inner surface 28 to the outer surface 32 via the cover surface 30 and then extend along the webs 15 shown in FIG. 1 to the second contact surfaces 50. The conductor tracks 55 are designed narrower than the first contact surfaces 20 and/or narrower than the second contact surfaces 50.

Figure 3:
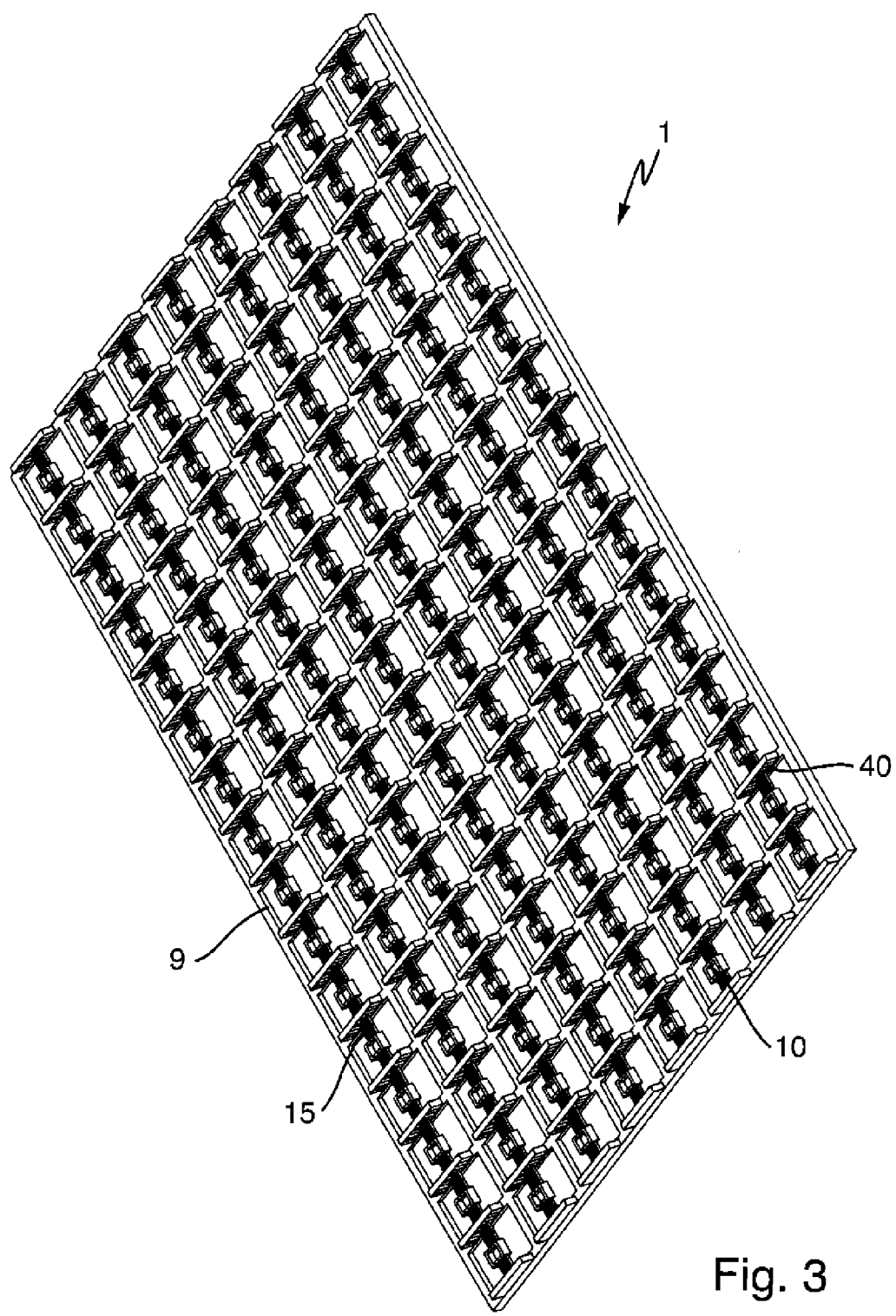
FIG. 3 illustrates an exemplary embodiment according to the invention of a test matrix adapter device with a plurality of segments.

FIG. 3 shows an embodiment according to the invention of a test matrix adapter device 1 with a plurality of segments 5 and with a plurality of semiconductor receiving devices 10. In the following, only the differences from the embodiment of FIG. 1 will be explained. It is shown that a plurality of ICs inserted in the semiconductor receiving device 10 can be measured with the plurality of segments 5 without further set-up times at a final tester being necessary after contacting the test matrix adapter device 1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A test matrix adapter device comprising:
   a plurality of segments arranged in a plane, the segments having frame sections arranged in a line-shaped and column-shaped configuration, the segments being connected to one another via the frame sections;
   semiconductor receiving devices arranged within the segments, the semiconductor receiving devices having a plurality of first contact surfaces that are spaced apart from one another, the semiconductor receiving devices being connected to frame sections of an associated segment via webs, the semiconductor receiving devices having an underside and a base region which is at least partially enclosed by a frame, and an outer side, and a frame of the semiconductor receiving devices has an inner surface and an outer surface; and projections formed on column-shaped frame sections, the projections having second contact surfaces that are connected to the first contact surfaces via conductor tracks, wherein the semiconductor receiving device is adapted to receive a semiconductor component with terminal contacts and to connect the terminal contacts to the first contact surfaces, and wherein the webs extend outward from the semiconductor receiving devices to the frame sections for connecting the first contact surfaces to the second contact surfaces.

2. The test matrix adapter device according to claim 1, wherein the segments arranged in matrix form are square-shaped and arranged in a flat plane.

3. The test matrix adapter device according to claim 1, wherein precisely one semiconductor receiving device is formed in each of the segments, wherein the base region is completely enclosed by the square-shaped frame, and wherein the conductor tracks connected to the first contact surfaces are guided from the inner surface via the cover surface to the outer surface and the conductor tracks are guided along the webs to the second contact surfaces.

4. The test matrix adapter device according to claim 1, wherein each of the conductor tracks are integrally formed with the contact surfaces and or wherein the conductor tracks are integrally connected to the base.

5. The test matrix adapter device according to claim 1, wherein the conductor tracks are narrower than the contact surfaces.

6. The test matrix adapter device according to claim 1, wherein the webs are made of a plastic and/or of a metal that forms the conductor tracks.

7. The test matrix adapter device according to claim 1, wherein the first contact surfaces are formed on the inner surface and/or in the base region.

8. The test matrix adapter device according to claim 1, wherein the base region is planar or has a topography.

9. The test matrix adapter device according to claim 1, wherein the projection is cuboid and wherein the second contact surfaces are formed on a front side and/or on a rear side of the projection.

10. The test matrix adapter device according to claim 1, wherein the frame sections and the semiconductor receiving device are formed from a plastic suitable for injection-molding.

11. The test matrix adapter device according to claim 1, wherein the semiconductor component rests on the base region within the frame when the semiconductor component is being measured.

12. The test matrix adapter device according to claim 1, wherein the semiconductor receiving device has, on an underside, large first contact surfaces acting as capacitive sensors.

13. The test matrix adapter device according to claim 1, wherein the semiconductor receiving device is adapted to receive bare semiconductor components.

14. The test matrix adapter device according to claim 1, wherein the test matrix adapter device contacts a plurality of IC packages formed in semiconductor receiving devices via a final tester.

15. The test matrix adapter device according to claim 1, wherein the test matrix adapted performs force and/or sense measurements via a double contacting of the second contact surfaces.

16. The test matrix adapter device according to claim 1, wherein at least two webs extend outward from one of the semiconductor receiving devices to one of the frame sections.

17. The text matrix adapter device according to claim 16, wherein at least one of the two webs has a conductor track.

* * * * *